United States Patent
Bhusanur et al.

(10) Patent No.: US 11,415,640 B2
(45) Date of Patent: Aug. 16, 2022

(54) RESISTIVE ISOLATION DETECTION METHODS AND SYSTEMS

(71) Applicant: sonnen, Inc., Stone Mountain, GA (US)

(72) Inventors: Chetan Bhusanur, Stone Mountain, GA (US); Carlos Restrepo, Atlanta, GA (US)

(73) Assignee: Sonnen, Inc., Stone Mountain, GA (US)

( * ) Notice: Subject to any disclaimer, the term of this patent is extended or adjusted under 35 U.S.C. 154(b) by 109 days.

(21) Appl. No.: 17/146,599

(22) Filed: Jan. 12, 2021

(65) Prior Publication Data

US 2022/0221526 A1    Jul. 14, 2022

(51) Int. Cl.
    *G01R 31/52*    (2020.01)
    *H02S 40/32*    (2014.01)
    *H02S 50/10*    (2014.01)

(52) U.S. Cl.
    CPC .............. *G01R 31/52* (2020.01); *H02S 40/32* (2014.12); *H02S 50/10* (2014.12)

(58) Field of Classification Search
    CPC .......... H02S 50/10; H02S 40/32; G01R 31/52
    See application file for complete search history.

(56) References Cited

U.S. PATENT DOCUMENTS

| | | | |
|---|---|---|---|
| 9,825,555 B2 | 11/2017 | Onishi | |
| 9,933,463 B2 | 4/2018 | Danesh et al. | |
| 10,411,479 B2 | 9/2019 | Weng et al. | |
| 2016/0336899 A1 | 11/2016 | Ledenev et al. | |
| 2017/0207620 A1* | 7/2017 | Zhu | H02H 7/122 |

FOREIGN PATENT DOCUMENTS

| | | |
|---|---|---|
| CN | 103048544 | 4/2013 |
| CN | 103250061 | 8/2013 |
| KR | 101097840 | 12/2011 |
| KR | 101665952 | 10/2016 |
| KR | 101677930 | 11/2016 |
| KR | 102112562 | 5/2020 |

\* cited by examiner

*Primary Examiner* — Clayton E. LaBalle
*Assistant Examiner* — Michael A Harrison
(74) *Attorney, Agent, or Firm* — Clive McClintock

(57) ABSTRACT

Implementations described herein relate to methods, apparatuses, and systems of leakage current detection. According to one implementation, a method includes initiating self-test of a resistive isolation detection circuit, the self-test configured to return a reset latched value representative of a state of the resistive isolation circuit, pulsing a latch reset signal to clear the reset latched value and a testing signal to indicate a testing state, and during the testing signal, independently determining, that a leakage current is present between a photovoltaic power conversion device positive channel and earth, and, that a leakage current is present between a photovoltaic power conversion device negative channel and earth. The method also includes operating a safety relay and indication signal responsive to the testing signal and the independent determining.

20 Claims, 14 Drawing Sheets

LOW SIDE DETECTION CIRCUIT

HIGH SIDE DETECTION CIRCUIT

RESISTIVE ISOLATION DETECTION METHODS AND SYSTEMS

TECHNICAL FIELD

Embodiments relate generally to electrical power, and more particularly, to methods, apparatuses, and systems of resistive isolation detection.

BACKGROUND

Resistive isolation detection (RISO) may be used to detect insulation failure from devices. For example, some RISO circuitry may be designed to ensure safety of electrical power devices involving safety protective earth as part of system. Generally, conventional insulation failure detection devices operate with off-the-shelf components such as cable loop or clamping style voltage and/or amperage metering devices. These off-the-shelf components are designed to operate across a wide-range of voltages and amperages, and therefore, suffer from drawbacks including lack of fidelity/ granularity of readings, increased error rates, and increased cost.

It is with regard to these and other drawbacks to which the following detailed description is presented in comparison.

SUMMARY

Aspects and advantages of the invention will be set forth in part in the following description, or may be obvious from the description, or may be learned through practice of the invention.

According to one implementation, a resistive isolation detection method is described. The method comprises: initiating self-test of a resistive isolation detection circuit, the self-test configured to return a reset latched value representative of a state of the resistive isolation circuit; pulsing a latch reset signal to clear the reset latched value and a testing signal to indicate a testing state; during the testing signal, independently determining, that a leakage current is present between a photovoltaic power conversion device positive channel and earth, and, that a leakage current is present between a photovoltaic power conversion device negative channel and earth; and, operating a safety relay and indication signal responsive to the testing signal and the independent determining.

According to some implementations, the reset latched value is a hardware latch signal operative to maintain the safety relay in an open state responsive to a failed self-test.

According to some implementations, the reset latched value is a hardware latch signal operative to maintain the safety relay in an open state responsive to a leakage current being present at either of the photovoltaic power conversion device positive channel and earth, and, the photovoltaic power conversion device negative channel and earth.

According to some implementations, the testing signal is maintained for a duration of the independently determining.

According to some implementations, operating the safety relay comprises: maintaining an open state of the safety relay responsive to a leakage current being present between a photovoltaic power conversion device positive channel and earth.

According to some implementations, operating the safety relay comprises: maintaining an open state of the safety relay responsive to a leakage current being present between a photovoltaic power conversion device negative channel and earth.

According to some implementations, operating the safety relay comprises: initiating a closed state of the safety relay responsive to no leakage current being present between a photovoltaic power conversion device positive channel and earth.

According to some implementations, operating the safety relay comprises: initiating a closed state of the safety relay responsive to no leakage current being present between a photovoltaic power conversion device negative channel and earth.

According to some implementations, the latch reset signal is enabled responsive to a successful self-test.

In one implementation, a resistive isolation detection circuit is described. The resistive isolation circuit comprising an event manager system configured to perform testing operations comprising: initiating self-test of a resistive isolation detection circuit, the self-test configured to return a reset latched value representative of a state of the resistive isolation circuit; pulsing a latch reset signal to clear the reset latched value and a testing signal to indicate a testing state; during the testing signal, independently determining, that a leakage current is present between a photovoltaic power conversion device positive channel and earth, and, that a leakage current is present between a photovoltaic power conversion device negative channel and earth; and, operating a safety relay and indication signal responsive to the testing signal and the independent determining.

In one implementation, a system is described, comprising: a photovoltaic cell; a power conversion device in operative communication with the photovoltaic cell; and a resistive isolation detection circuit in operative communication with the power conversion device, wherein the resistive isolation detection circuit is configured to perform testing operations comprising: initiating self-test configured to return a reset latched value representative of a state of the resistive isolation circuit; pulsing a latch reset signal to clear the reset latched value and a testing signal to indicate a testing state; during the testing signal, independently determining, that a leakage current is present between the photovoltaic power conversion device positive channel and earth, and, that a leakage current is present between the photovoltaic power conversion device negative channel and earth; and, operating a safety relay and indication signal responsive to the testing signal and the independent determining.

According to some implementations, the system further comprises a photovoltaic inverter in operative communication with the power conversion device.

According to some implementations, the photovoltaic power inverter is configured to invert DC power received from the power conversion device into AC power for a power grid.

According to some implementations, the system further comprises a plurality of photovoltaic cells in operative communication with the power conversion device.

According to some implementations, the resistive isolation circuit comprises an event manager system configured to perform the testing operations.

According to some implementations, the reset latched value is a hardware latch signal operative to maintain the safety relay in an open state responsive to a failed self-test.

According to some implementations, the reset latched value is a hardware latch signal operative to maintain the safety relay in an open state responsive to a leakage current being present at either of the photovoltaic power conversion device positive channel and earth, and, the photovoltaic power conversion device negative channel and earth.

According to some implementations, the testing signal is maintained for a duration of the independently determining.

According to some implementations, operating the safety relay comprises: maintaining an open state of the safety relay responsive to a leakage current being present between a photovoltaic power conversion device positive channel and earth; and, maintaining an open state of the safety relay responsive to a leakage current being present between a photovoltaic power conversion device negative channel and earth.

According to some implementations, operating the safety relay comprises: initiating a closed state of the safety relay responsive to no leakage current being present between a photovoltaic power conversion device positive channel and earth; and, maintaining a closed state of the safety relay responsive to no leakage current being present between a photovoltaic power conversion device negative channel and earth.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION

Figure 1:
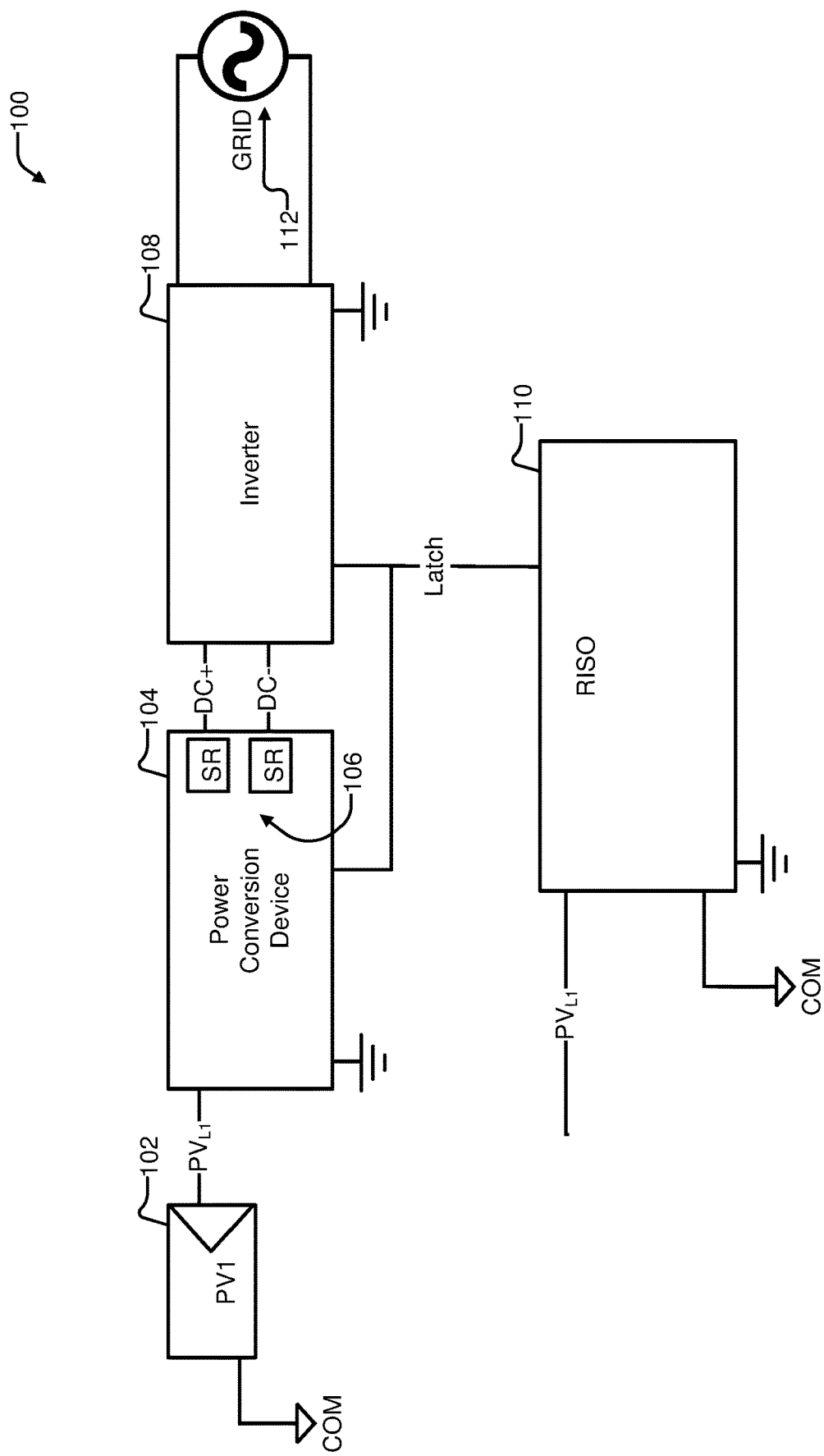
FIG. 1 is a schematic of an example photovoltaic system, in accordance with some implementations.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the term "or" is generally intended to be inclusive (i.e., "A or B" is intended to mean "A or B or both"). Furthermore, as used herein, terms of approximation, such as "approximately" or "substantially," refer to being within a ten percent margin of error.

Various timing diagrams described herein include approximated timing windows, presented in an approximate number of milliseconds or other values. Such approximated timing windows may be altered depending upon any desired implementation. Furthermore, an exclamation point "!" immediately prior to a signal name from the various FIGURES indicates an inverted signal.

As used herein, the term "discrete" may generally refer to a discrete component that may be interfaced to directly, unless the context of use clearly indicates otherwise. Furthermore, as used herein, the term "integrated" may generally refer to an integrated component, such as a component of an integrated circuit, unless the context of use clearly indicates otherwise.

One or more implementations described herein relate to resistive isolation detection (RISO) of photovoltaic power systems. RISO circuits & methods, including photovoltaic (PV) insulation detection & PV isolation detection circuits, configured to detect leakage current on independent PV channels, are described in detail. Associated testing may be operative to detect leakage currents. According to one implementation, testing may be operative to detect leakage currents prior to power conversion activity, and prior to connection of an AC or power inverter to DC rails of a PV system. In this manner, testing may occur prior to connection to a power grid.

The detection circuits may be implemented within an inverter, external to the inverter, or in combination—with internal and external components. Furthermore, signaling components, including indication lights, displays, communication signals, or other similar signaling components, may inform a user of the state of the testing, including whether any portion of the test was successful or failed.

The testing sequence includes at least two portions: a self-test and an insulation test. The self-test may initiate first, determining that the testing circuitry is operational prior to the insulation test. The insulation test may occur independently for each portion of the inverter (PV+ to earth; PV− to earth); thus, multiple insulation tests may occur subsequent to the initial self-test to ensure compliance with any governing safety protocols, rules, guidelines, or procedures.

Turning now to the FIGURES, the above-referenced RISO circuits & methods are described in detail. FIG. 1 is a schematic of an example photovoltaic system 100, in accordance with some implementations.

The system 100 may include, at least, a photovoltaic (PV) cell 102, a power conversion device 104 in operative communication with the PV cell 102, and a RISO circuit 110 in operative communication with the power conversion device 104. Generally, the PV cell may include one or more photo-sensitive components configured to produce electrical power in response to an external source of illumination, for example, the Sun. The PV cell 102 may include various configurations of individual components, wiring, and other components. The PV cell may produce electrical power transmitted via $PV_{L1}$ to the power conversion device 104.

The power conversion device 104 is a device configured to convert electrical power received from the PV cell 102 into DC electrical power (DC+, DC−). For example, the power conversion device may receive power transmitted via a $PV_{L1}$ and convert the same to specified DC levels (e.g., 24 VDC). The power conversion device 104 may include one or more safety relays 106 configured to sever the DC rails DC+ and DC− in response to a relay signal.

The RISO circuit 110 is a device configured to perform the initial self-test referenced above, as well as provide a reset latched value "LATCH". The self-test may be a test performed to self-identify appropriate operation of individual components of the RISO circuit 110. The self-test may be performed initially, and may manipulate the reset latched value LATCH responsive to a failed test. The RISO circuit 110 is also configured to detect resistive isolation failure of any portion of the power conversion device 104, such as due to insulation failure detectable as a leakage current and/or voltage. Accordingly, the RISO circuit 110 is further configured to manipulate the reset latched value LATCH responsive to any detected leakage current and/or voltage. For example, in response to the reset latched value LATCH, the safety relays 106 may maintain a disconnected state of the DC rails DC+ and DC−.

According to one implementation, the reset latched value LATCH may be retained in an inactive state if there is no leakage current and/or voltage detected, thereby allowing the safety relays 106 to be operated. According to this example, the reset latched value LATCH may be placed in an active state if there is leakage current and/or voltage detected, thereby stopping closure of contacts of the safety relays 106.

Alternatively, according to one implementation, the reset latched value LATCH may be retained in an active state if there is no leakage current and/or voltage detected, while also being retained in an inactive state if there is leakage current and/or voltage detected. All such combinations of the reset latched value LATCH are within the scope of example embodiments.

As further illustrated in FIG. 1, the system 100 may also include an inverter 108 (e.g., a PV inverter or other inverter) in operative communication with the power conversion device 104 and a power grid 112. The inverter 108 may optionally include communication with the reset latched value LATCH. The inverter 108 may include any suitable inverter, for example, a DC–AC inverter configured to invert the DC power rails DC+ and DC− to AC electrical power for interface with the electrical power grid 112 (e.g., 120 VAC, 240 VAC, 480 VAC, etc.). The inverter 108, if in communication with the reset latched value LATCH, may further be configured to operate any associated safety relays responsive to the reset latched value LATCH. In this manner, further safety may be realized under some circumstances.

While the system 100 is an exemplary system illustrated to depict general operation and concepts described herein, the same may be varied according to any desired implementation. For example, according to some implementations, more than one PV cell may be interfaced with the power conversion device 104. Similarly, additional components, such as signaling components configured to display a signal indicative of the state of the RISO circuit 110, may also be applicable. Furthermore, additional signals may be provided by the RISO circuit 100, as described in more detail below.

Figure 2:
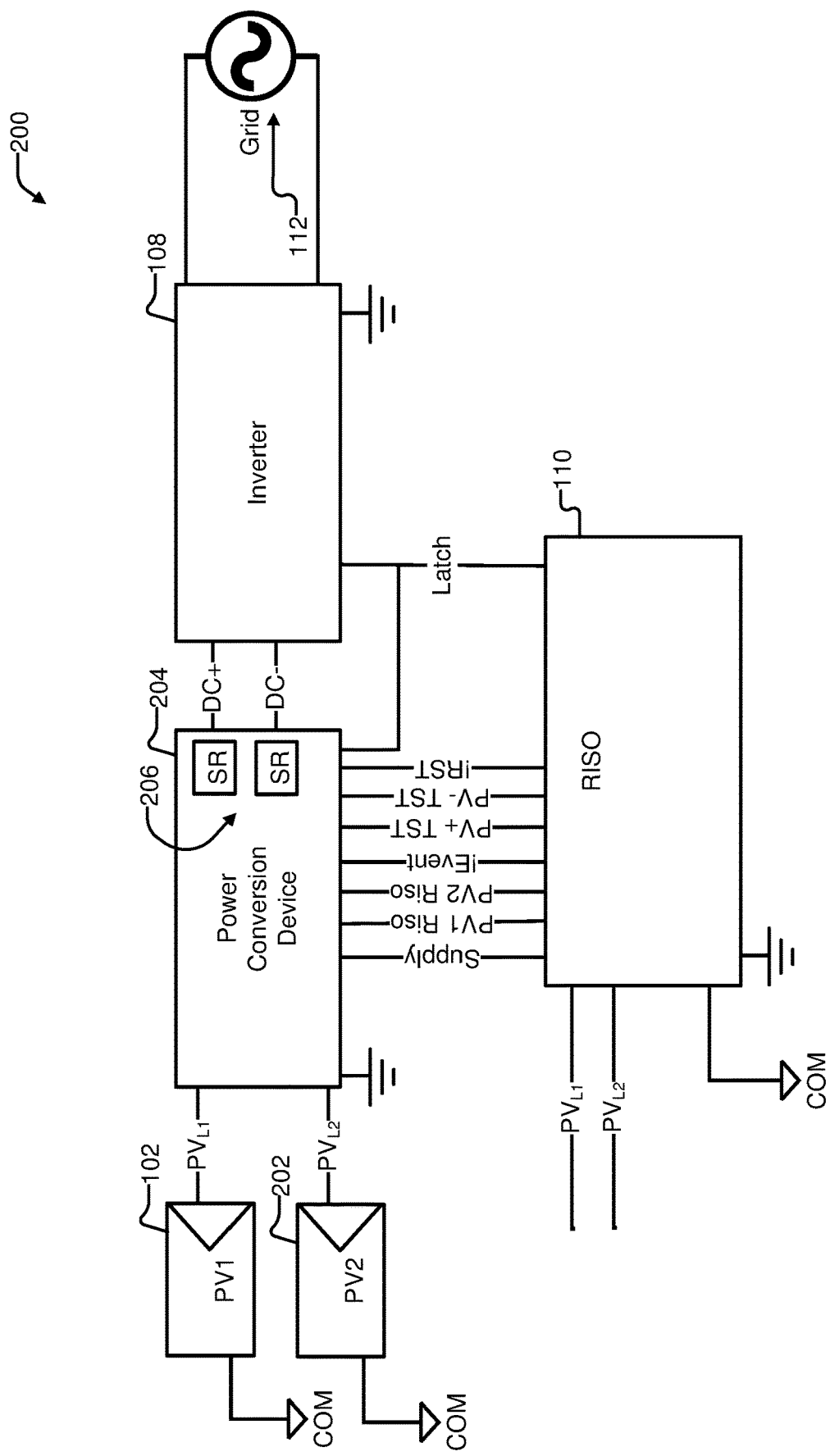
FIG. 2 is a schematic of an additional example photovoltaic system, in accordance with some implementations.

FIG. 2 is a schematic of an additional example photovoltaic system 200, in accordance with some implementations. The system 200 may be similar to the system 100, and may include one or PV cells 102, 202, power conversion device 206 having safety relays 206, inverter 108, and RISO circuit 110. As illustrated, the additional PV cell 202 may be in operative communication with the power conversion device 204 via $PV_{L2}$. Furthermore, the power conversion device 204 may operate safety relays 206 similarly as described above.

As further illustrated, the RISO circuit 110 may provide/receive additional signals to/from the power conversion device 204. For example, the RISO circuit 110 may receive a supply voltage SUPPLY from the power conversion device. Furthermore, the RISO circuit 110 may provide individual signals indicative of leakage current detection associated with PV cell 102 and PV cell 202 (e.g., PV1 RISO, PV2 RISO). The RISO circuit 110 may also provide a testing signal EVENT indicative of a state of testing for leakage current. The RISO circuit 110 may also receive a reset signal RST configured to reset a state of the RISO circuit 110. Finally, the reset latched value LATCH is also provided by the RISO circuit 110. Generally, operation and states of the individual signals is described more fully with reference to FIGS. 12-14 and the method 1500.

As described above, systems with resistive isolation detection may include, at least, a PV cell, a power conversion device in operative communication with the PV cell, and a RISO circuit in operative communication with the power conversion device. The RISO circuit is configured and operative to conduct an initial self-test, and upon a successful initial self-test, determine if a leakage current exists. The leakage current may indicate a failure of insulation at any PV cell. The RISO circuit may further provide a reset latched value configured to block connection (e.g., through a safety relay(s)) between the power conversion device and DC rails of a power inverter. In this manner, the system 100 and system 200 may safely determine insulation failure prior to connection to a power inverter, and therefore, a power grid.

Hereinafter, various circuits of each of the power conversion device, RISO circuit, and inverter are described with reference to FIGS. 3-11. Although presented as possible circuitry for implementation in the above-described systems, it should be understood that multiple variations, additions, and omissions of individual components are possible. Accordingly, the below described examples are non-limiting of every implementation.

Figure 3:
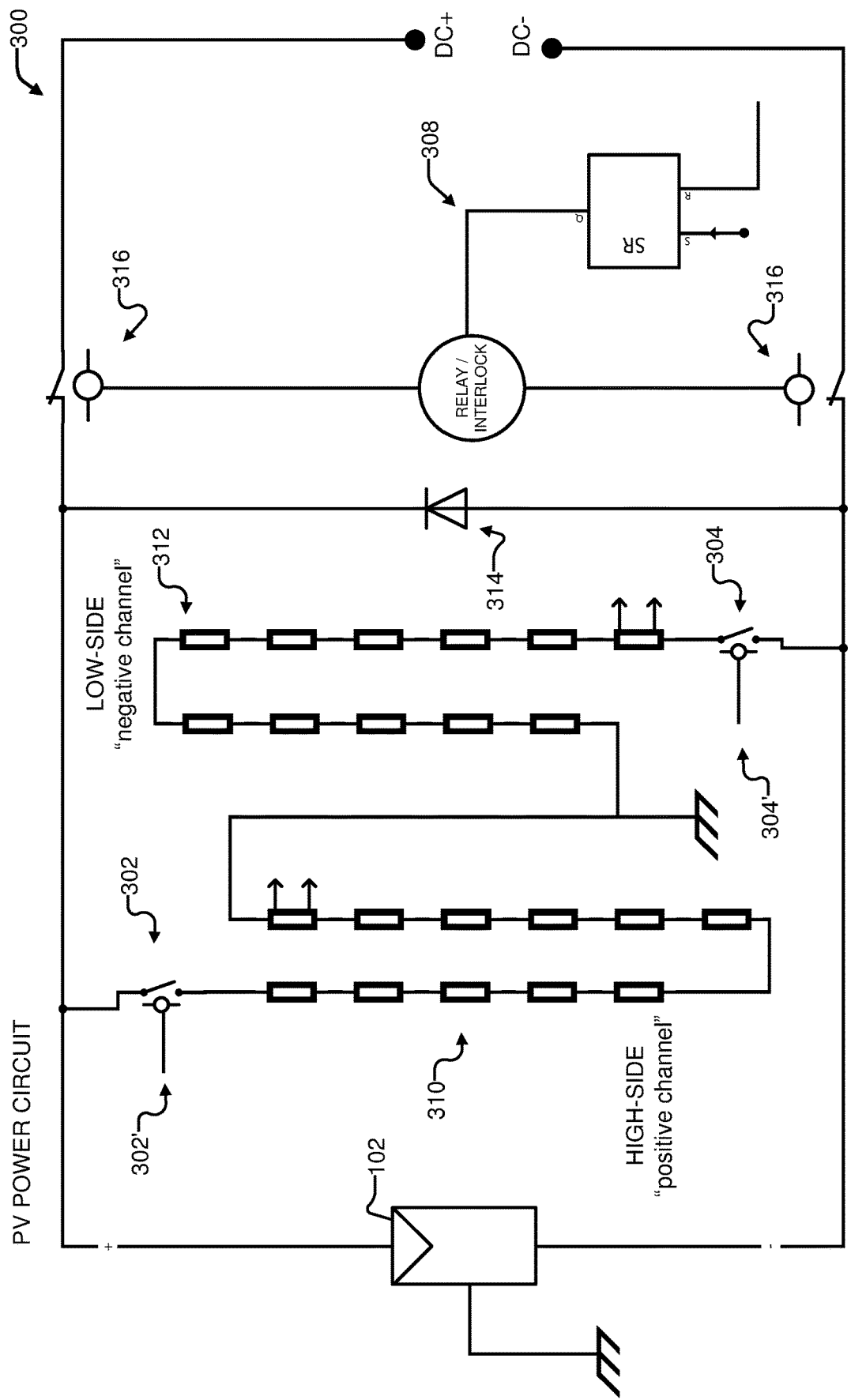
FIG. 3 is a schematic of an example photovoltaic power circuit, in accordance with some implementations.

FIG. 3 is a schematic of an example photovoltaic power circuit 300, in accordance with some implementations. The PV power circuit 300 may be an example implementation of the power conversion device 104 and/or 204. Generally, the PV power circuit 300 can include connections to the PV cell 102 for receiving power generated at the PV cell 102.

Figure 11:
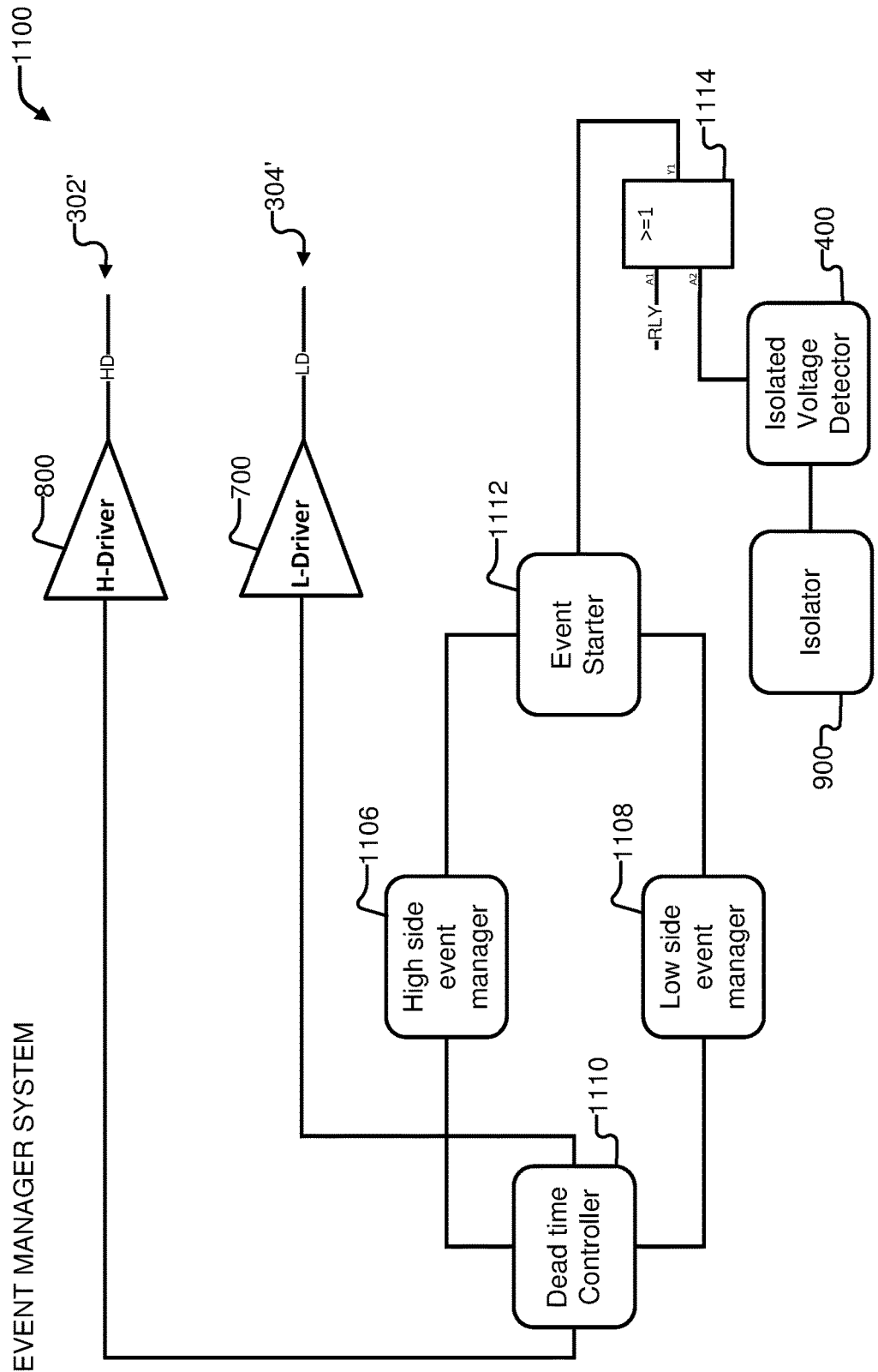
FIG. 11 is a schematic of an example event manager system using the circuits of FIGS. 4-10, in accordance with some implementations.

Power from the PV cell 102 may be connected/disconnected through operation of switches 302 and 304, for example, through control signals 302' and 304' received from an event manager system (e.g., FIG. 11). Power received from the PV cell 102 may be converted to DC rail voltages DC+ and DC− through resistive networks 310 and 312. The resistive networks 310 and 312 may be referred to herein as a "high-side" and "low-side" and/or "positive channel" and "negative channel." Generally, individual resistors can be integrated or discrete, although illustrated as integrated in FIG. 3.

DC rail voltages DC+ and DC− may be separated by diode 314, and may be disconnected from external components (e.g., disconnected from an inverter) through operation of safety relay 308 and interlock 316. The safety relay 308 and interlock 316 may physically sever/connect the DC rails, and may be responsive to control signals based on the reset latched value LATCH described above.

The reset latched value LATCH may be operated based on the detection of leakage current (e.g., current and/or voltage). Accordingly, a detection circuit (or both high-side and low-side detection circuits) may be integrated within the RISO circuit for operation of the reset latched value LATCH.

Figure 4:
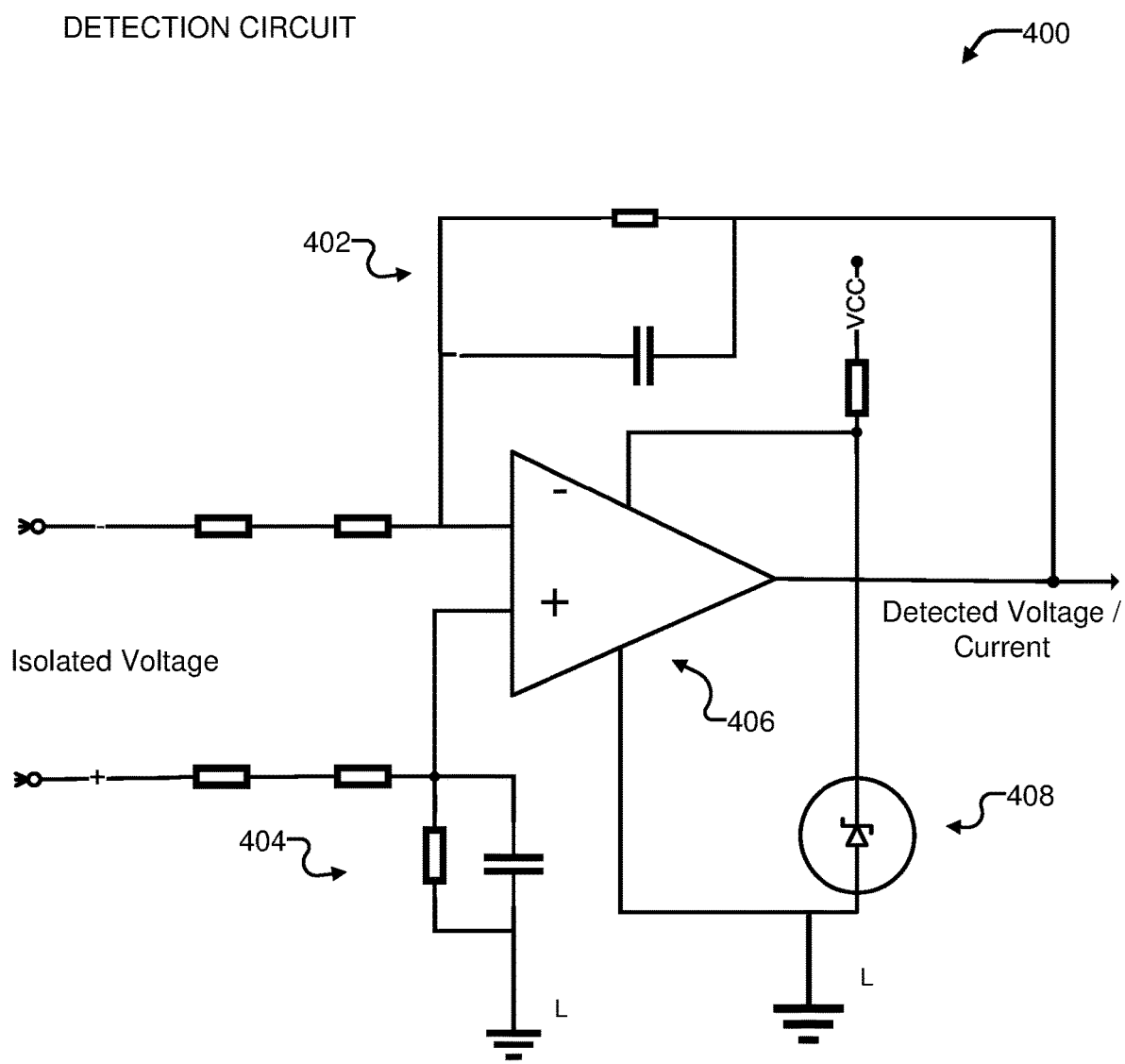
FIG. 4 is a schematic of an example detection circuit, in accordance with some implementations.

FIG. 4 is a schematic of an example detection circuit 400, in accordance with some implementations. The detection circuit 400 may be included within the RISO circuit 110, in some implementations. For example, the detection circuit 400 may be configured to detect current flowing through leakage path and amplify the signal.

The detection circuit 400 may include two RC networks 402, 404 in operative communication with op-amp 406 and discrete zener diode 408. For example, upon detection of leakage current, the circuit 400 will condition and amplify the signal as voltage. The resistors connected to op-amp 406 determine the level of amplification factor. The discrete zener diode 408 will provide accurate regulated supply to the circuit for increased accuracy of the system. The output of this circuit is an analog voltage value.

As described above, RISO circuit 110 may be configured to detect leakage current and/or voltage across multiple channels of PV cells. Furthermore, leakage current may be detected on both high and low sides of an associated power conversion device 104/204.

Figure 5:
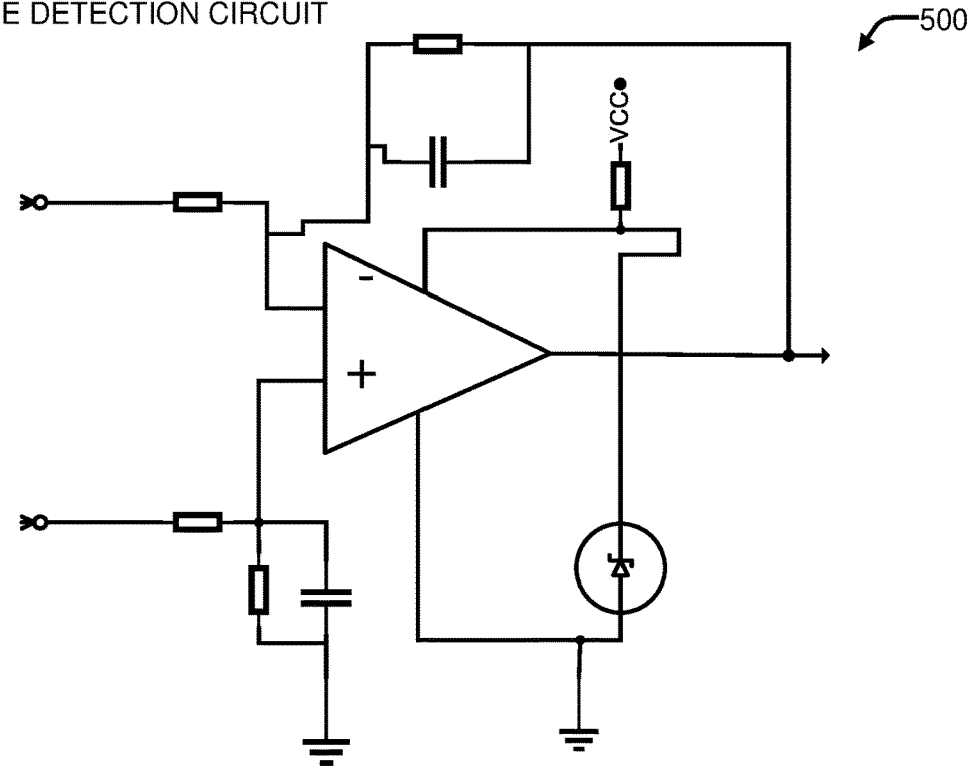
FIG. 5 is a schematic of an example low-side detection circuit, in accordance with some implementations.
Figure 6:
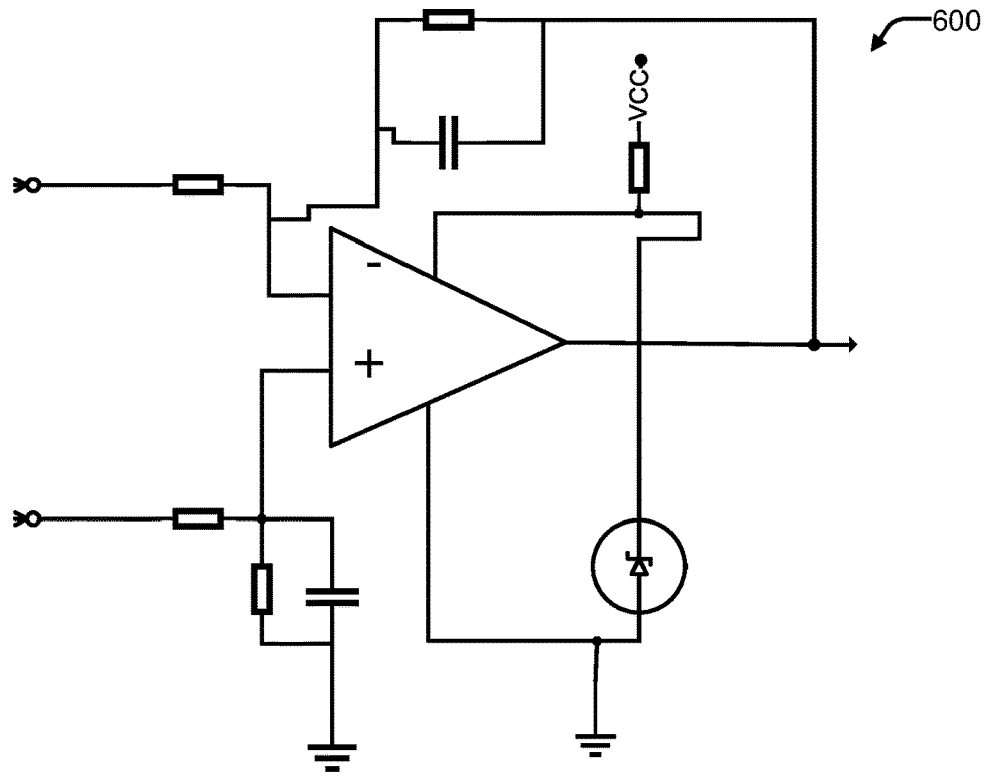
FIG. 6 is an schematic of an example high-side detection circuit, in accordance with some implementations.

FIG. 5 is a schematic of an example low-side detection circuit 500, and FIG. 6 is a schematic of an example high-side detection circuit 600, in accordance with some implementations. As depicted, both circuits 500 and 600 may be integrated within the RISO circuit 110 for detection of leakage current on a low-side and high-side of the power conversion device 104, 204. Furthermore, both the low-side detection circuit 500 and high-side detection circuit 600 are substantially similar to the detection circuit 400, described in detail above. Accordingly, additional detail of the operation of each circuit 500 and 600 is omitted herein for the sake of brevity.

Figure 7:
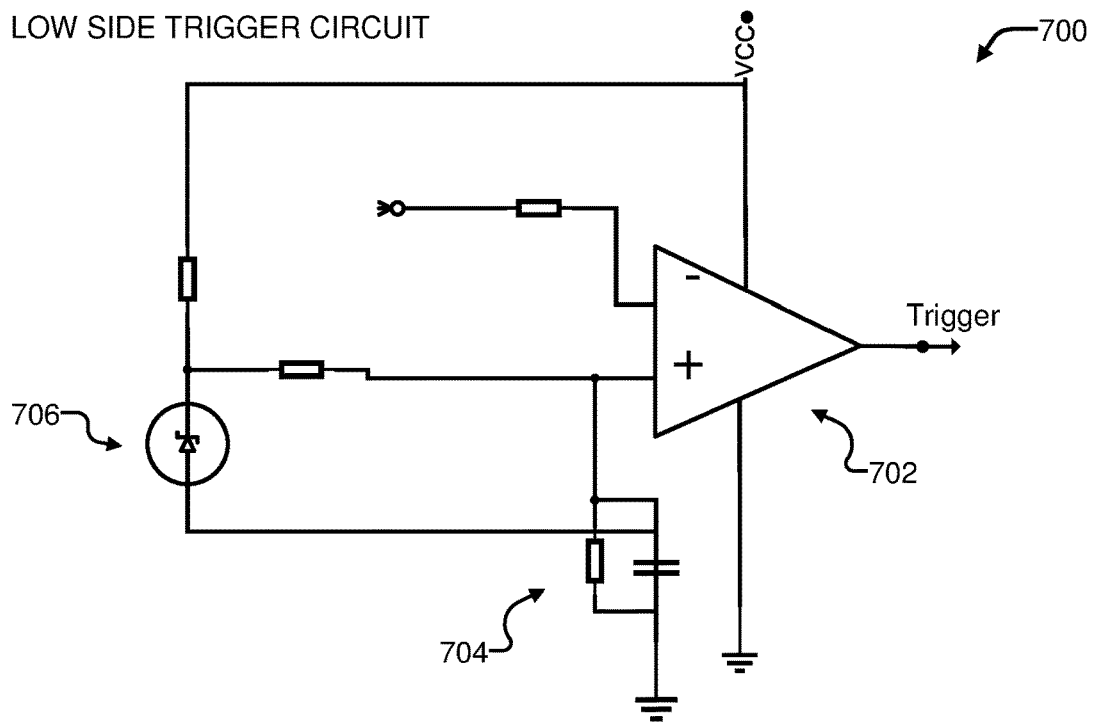
FIG. 7 is a schematic of an example low-side trigger circuit, in accordance with some implementations.

The RISO circuit 110 may also include trigger circuitry to trigger either low-side or high-side insulation failure/leakage detection. FIG. 7 is a schematic of an example low-side trigger circuit 700, in accordance with some implementations. The circuit 700 may include an integrated circuit device 702 configured to trigger the reset latched value LATCH. The circuit 700 may further include RC network 704 and discrete zener diode 706 for operating the device 702.

Figure 8:
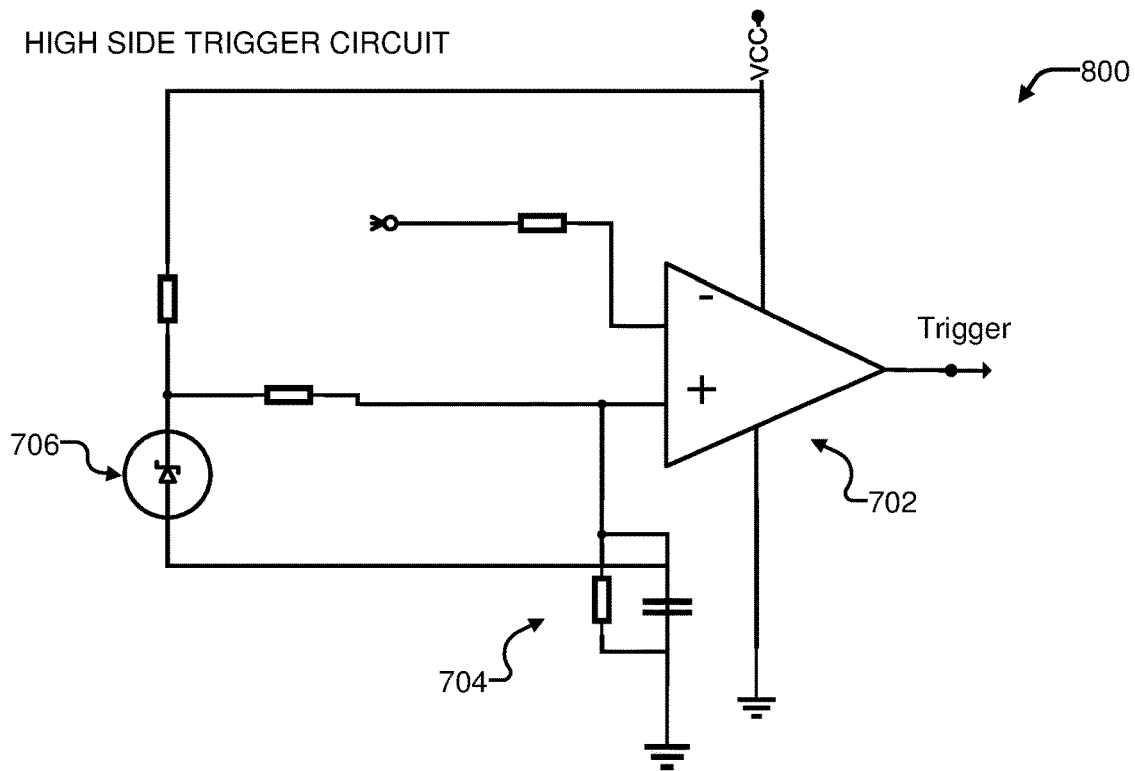
FIG. 8 is a schematic of an example high-side trigger circuit, in accordance with some implementations.

Similarly, a high-side trigger circuit may be implemented in the RISO circuit 110. FIG. 8 is a schematic of an example high-side trigger circuit 800, in accordance with some implementations. Circuit 800 is substantially similar to trigger circuit 700, and is configured to trigger disconnection of safety disconnects via direct or indirect signal.

Figure 9:
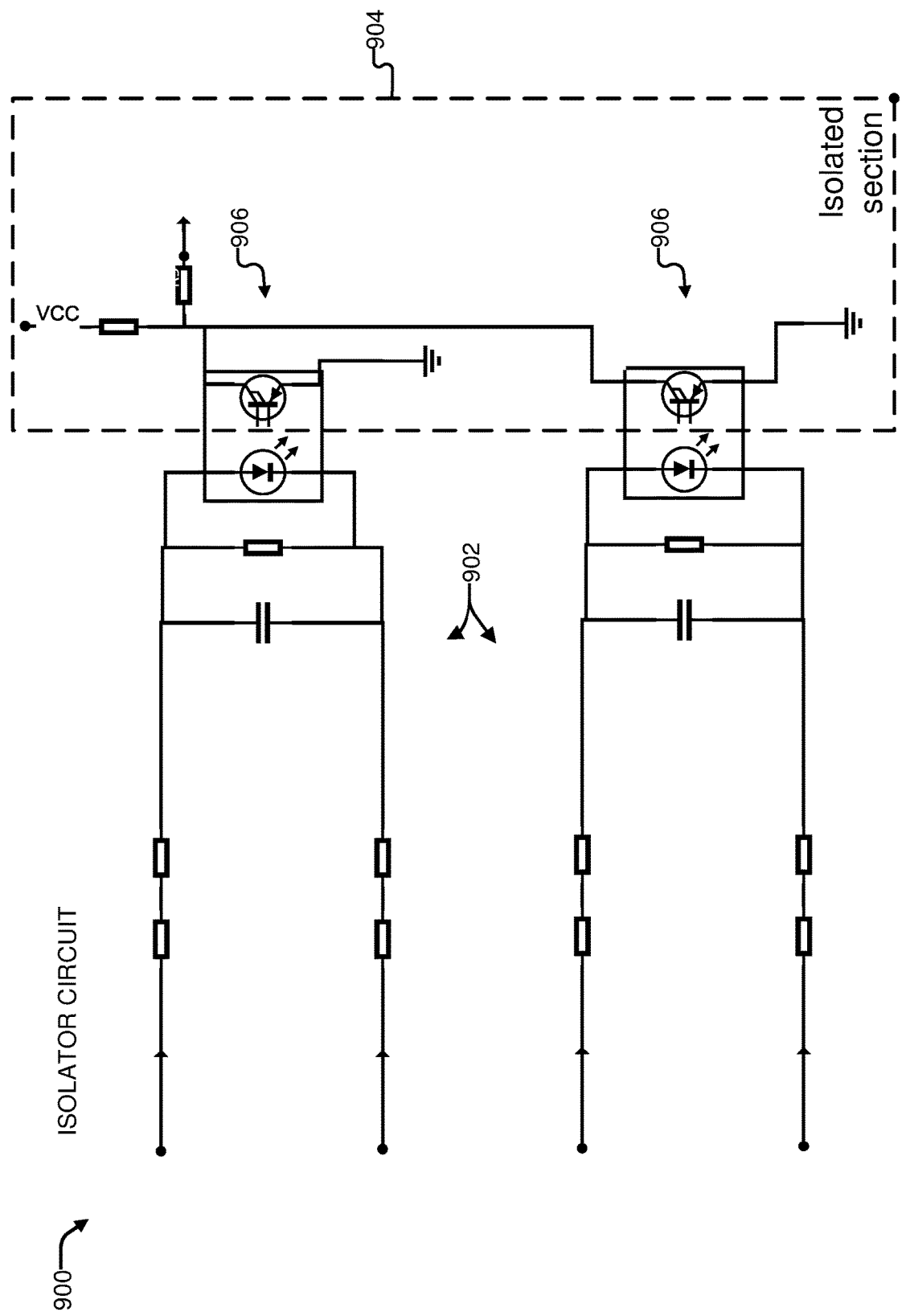
FIG. 9 is a schematic of an example isolator circuit, in accordance with some implementations.

In some implementations, isolation of electrical signals, for example, for reduction in noise and false positives/negatives in testing and to isolate high voltage from low voltage controller may be desirable. In these circumstances, isolation circuitry may be implemented in the RISO circuit 110. FIG. 9 is a schematic of isolator circuit 900, in accordance with some implementations. The isolation circuit 900 is configured to be a logical OR 902 that is opto-isolated through opto-isolators 906. Accordingly, isolated section 904 may be use to operate portions of the RISO circuit 110 without electrical noise.

Figure 10:
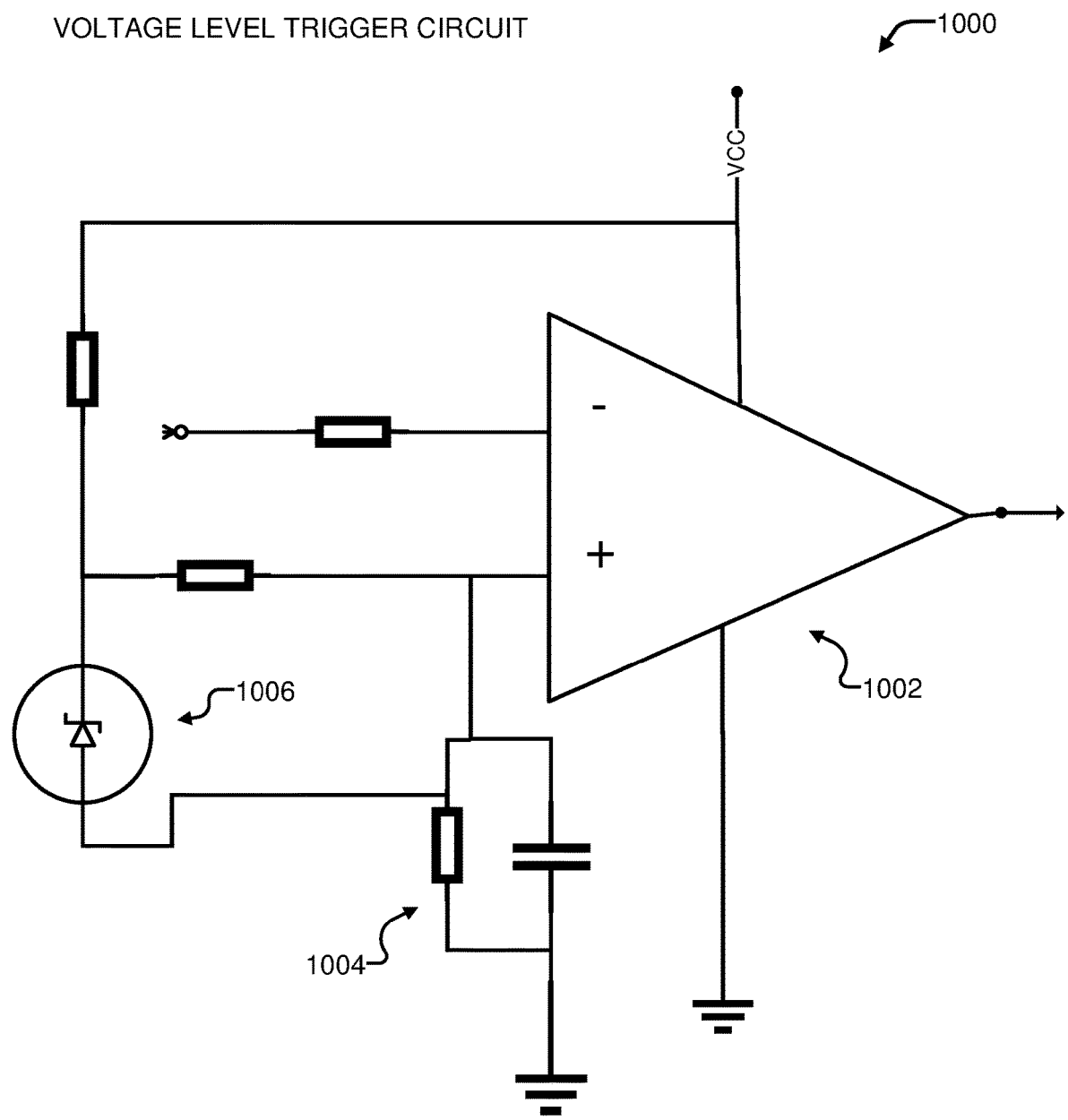
FIG. 10 is a schematic of a voltage level trigger circuit, in accordance with some implementations.

Finally, RISO circuit 110 may also include an initiation trigger, based on a threshold voltage received, to initiate a self-test and insulation failure/leakage detection operations. FIG. 10 is a schematic of a voltage level trigger circuit 1000, in accordance with some implementations.

Generally, the circuit 1000 may be substantially similar to trigger circuits 700 and 900. However, individual values for RC network 1004 and zener diode 1006 may be altered to operate device 1002 to trigger self-testing and insulation testing upon a voltage level (e.g., supply voltage SUPPLY, FIG. 2) exceeding a threshold. The threshold may be chosen based on any attribute, for example, 5 VDC or 12 VDC. Upon exceeding the threshold, device 1002 may output a signal to initiate self-test and insulation failure testing using the circuits described above.

For example, and without limitation, the RISO circuit 110 may be organized using an event manager system, such as illustrated in FIG. 11. FIG. 11 is a schematic of an example event manager system 1100 using the circuits of FIGS. 4-10, in accordance with some implementations. The system 1100 may be integrated within the RISO circuit 110, and may be operative to initiate self-testing, and insulation testing of independent PV channels, as described herein.

The event manager system 1100 may include high-side and low-side testing drivers 800, 700, respectively. The event manager system 1100 may further include both a high-side event manager 1106 and a low-side event manager 1108.

The event managers 1106 and 1108 are operative to initiate and control testing of the high-side of the power conversion device 104, 204 and the low-side of the power conversion device 104, 204, respectively. For example, a dead time controller 1110 may switch between high-side and low-side testing based upon a predetermined or desired time period (e.g., FIGS. 12-14).

Furthermore, an event starter 1112 may signal the dead time controller 1110 to begin testing upon conclusion of a successful self-test by the RISO circuit 110. The successful self-test may be signaled by testing relay 1114 upon receipt of signal from the isolated voltage detector circuit 400 (e.g., with input from isolator circuit 900). It is noted that as illustrated, the isolator circuit indicates based on a logical OR operation. However, a logical AND may also be applicable.

As described above, various circuits may be integrated to form the RISO circuit 110. Discrete and integrated components may be used to form each of the individual circuits 300, 400, 500, 600, 700, 800, 900, 1000, and 1100. The individual circuits may be triggered to initiate a self-test initially, followed by independent testing of PV channels of the system 100, 200. Furthermore, while illustrated as including either one or two PV channels, it should be readily understood that more or fewer channels, more or fewer PV cells, and more or fewer components/circuits may be applicable depending upon any desired implementation. Hereinafter, operation of the RISO circuit 110 is described in detail with reference to FIGS. 12-15.

The timing diagrams described below include representations of signals and states of various devices described with reference to FIG. 2. However, it is understood that the same is extensible to FIG. 1 and other implementations of insulation detection, for example, in power systems that are not photovoltaic. Furthermore, although particular values are shown, it should be understood that these values may be approximate, and may vary depending upon any desired characteristics of a final implementation, including speed of components, increases in testing time, decreases in testing time, delay in portions of a test (e.g., a delay between high-side and low-side testing, or vice versa), and other considerations.

Figure 12:
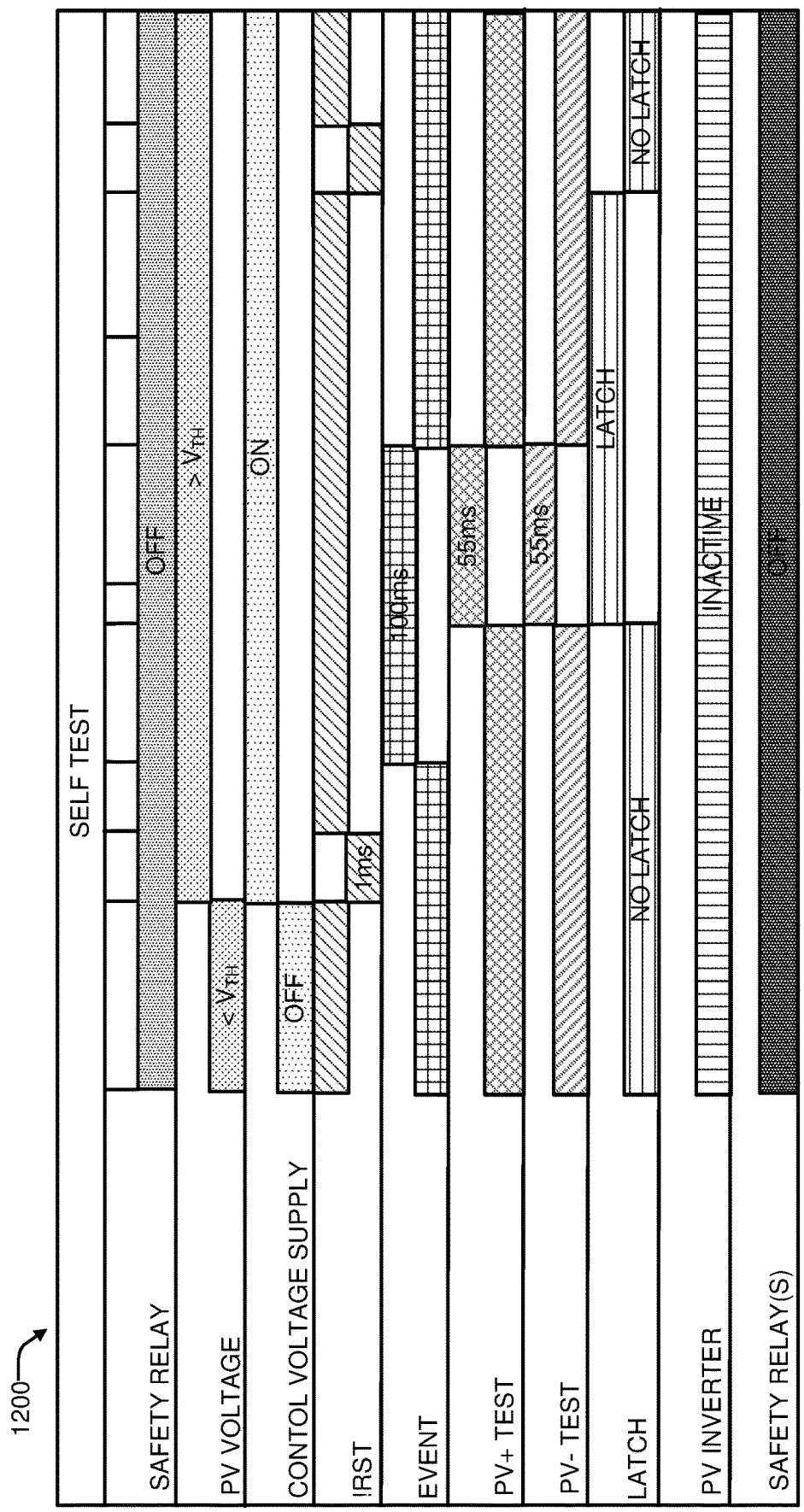
FIG. 12 is a timing diagram of a RISO self-test, in accordance with some implementations.

FIG. 12 is a timing diagram 1200 of a RISO self-test, in accordance with some implementations. The RISO self-test is a test that may be initiated prior to independent testing of PV channels of a photovoltaic system (e.g., 100 or 200). The RISO self-test (e.g., PV insulation failure detection test) will begin once PV voltage is greater than a set threshold and there is presence of a low power control voltage to power the circuit.

This self-test is carried out before any power conversion activity begins or when there is no active power conversion. The self-test initiates while safety relay 106, 206 is OFF and in an inactive state. Subsequently, or at substantially the same time, voltage from PV cell 102, 202 may increase and surpass a predetermined or desired threshold $V_{TH}$, and control voltage SUPPLY may power the RISO circuit 110.

Thereafter, RST may be pulsed for approximately 1 millisecond to clear the reset latched value LATCH, and testing signal EVENT may be held active for the duration of the self-test. In this example, the self-test may last for 100 milliseconds or more. However, a shorter or longer self-test may also be applicable.

During the testing signal EVENT, both PV+ TEST and PV− TEST may be pulsed high. Similarly, the reset latched value LATCH may also be latched high. PV+ TEST and PV− TEST may be pulsed for approximately 55 milliseconds, although shorter or longer durations may also be applicable. Upon successfully bringing both PV+ TEST and PV− TEST down to inactive after approximately 55 milliseconds, RST may be pulsed once again, for approximately 1 ms, to indicate the self-test is over. If the reset latched value LATCH successfully moves to the low or inactive state, the self-test concludes and the RISO circuit 110 is operating correctly.

As described above, as a result of the self-test, RISO circuit 110 will latch and a RST pulse is required to bring it out of latch. The final pulse of RST may initiate an independent test of leakage current/voltage of the system 100, 200, as illustrated in FIGS. 13-14.

Figure 13:
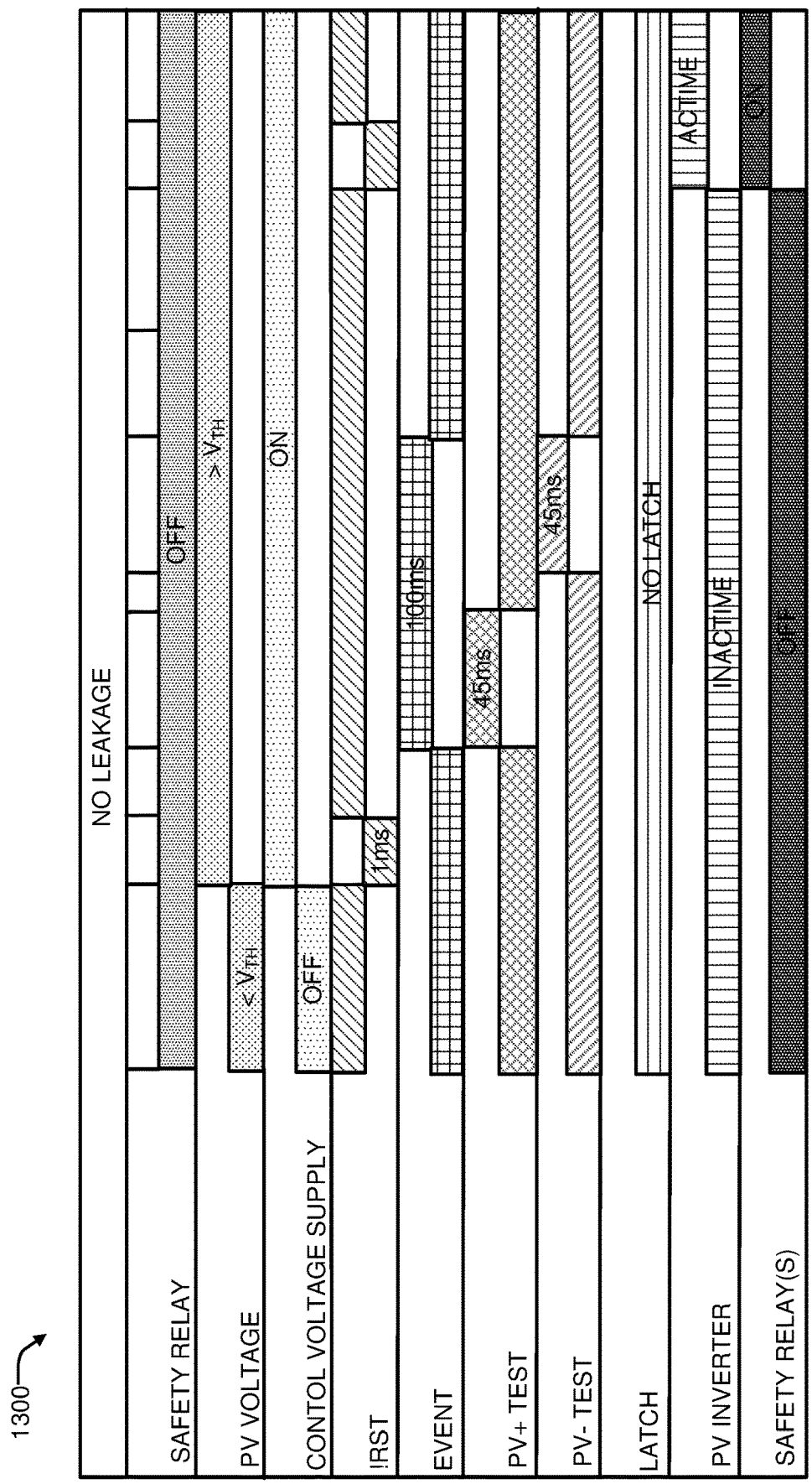
FIG. 13 is a timing diagram of a fully operational RISO, in accordance with some implementations.
Figure 14:
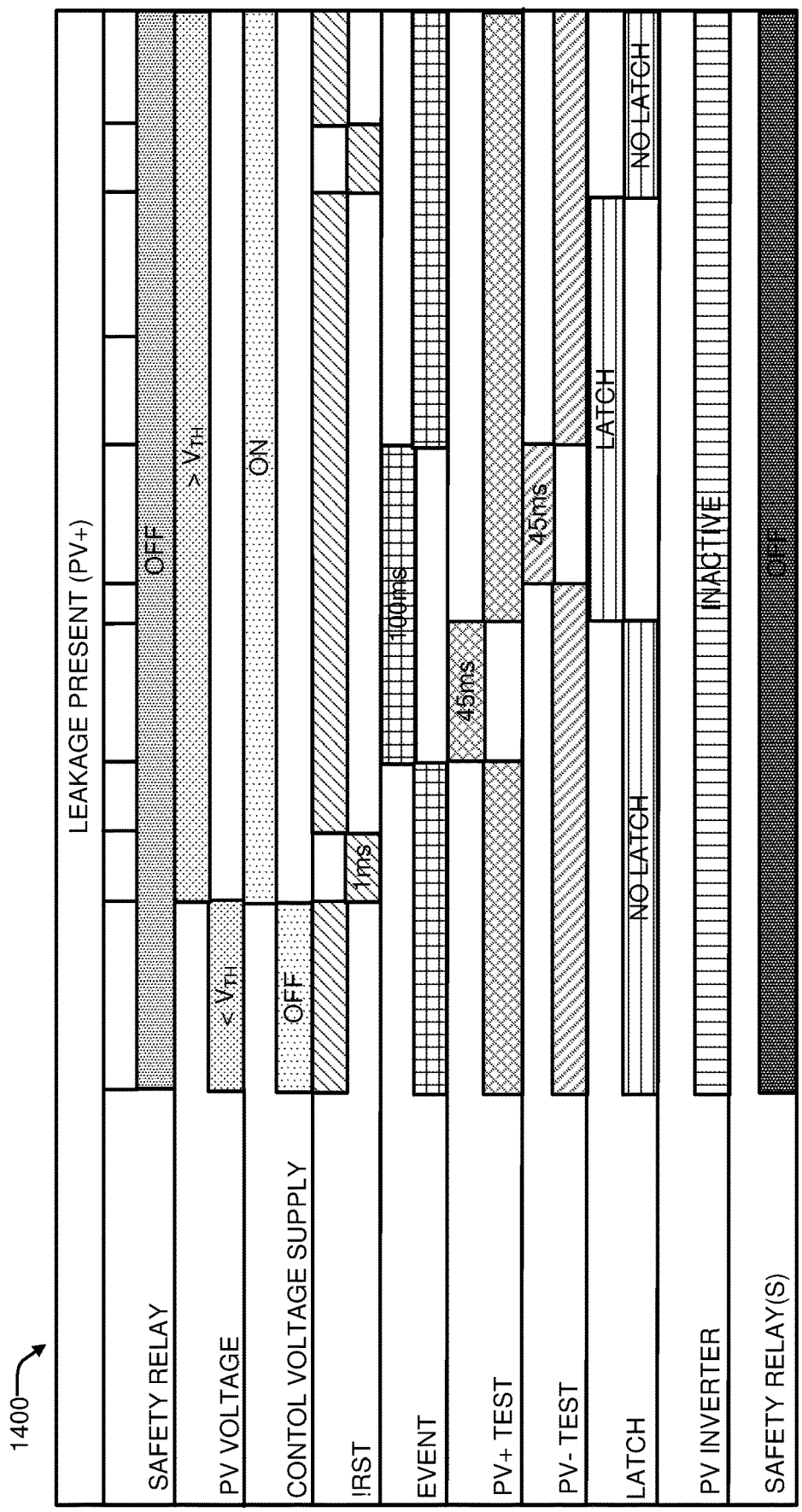
FIG. 14 is a timing diagram of a RISO detecting a leakage current, in accordance with some implementations.

FIG. 13 is a timing diagram 1300 of a fully operational RISO performing a PV channel test that succeeds, in accordance with some implementations. The PV channel test initiates while safety relay 106, 206 is OFF and in an inactive state. Subsequently, or at substantially the same time, voltage from PV cell 102, 202 may increase and surpass a predetermined or desired threshold $V_{TH}$, and control voltage SUPPLY may power the RISO circuit 110. Alternatively, the voltage from PV cell 102, 202 and the control voltage SUPPLY may be active and above the threshold from the self-test, described above.

Thereafter, RST may be pulsed for approximately 1 millisecond to ensure the reset latched value LATCH is still clear from the self-test, and testing signal EVENT may be held active for the duration of the PV channel test. In this example, the PV channel tests may last for 100 milliseconds or more. However, a shorter or longer testing, including longer for independent channels, may also be applicable.

During the testing signal EVENT, both PV+ TEST and PV− TEST may be pulsed high. The reset latched value LATCH may be latched low. PV+ TEST and PV− TEST may be pulsed for approximately 45 milliseconds, independently, for each respective test; although shorter or longer durations may also be applicable. Upon successfully bringing both PV+ TEST and PV− TEST down to inactive after approximately 45 milliseconds, with no trigger from leakage current, the testing may be complete and successful.

Accordingly, after the testing of each independent PV channel, the safety relay and inverter may be brought into active/ON states, respectively. Generally, the safety relay and inverter may be operated according to the state of the reset latched value LATCH (e.g., FIG. 1) and/or any of the individually supplied testing signals (e.g., FIG. 2). Finally, after completion of the test and operation of the safety relay(s), the systems 100, 200 may operate to produce power at PV cell 102, 202 and supply inverted power to a power grid, 112.

However, if the test is unsuccessful, thereby indicating leakage current or voltage, and a failed insulator test, the safety relay(s) may remain in an inactive or OPEN state, as shown in FIG. 14. FIG. 14 is a timing diagram 1400 of a RISO circuit 110 detecting a leakage current during independent PV channel tests, in accordance with some implementations.

The PV channel test of 1400 initiates while safety relay 106, 206 is OFF and in an inactive state. Subsequently, or at substantially the same time, voltage from PV cell 102, 202 may increase and surpass a predetermined or desired threshold $V_{TH}$, and control voltage SUPPLY may power the RISO circuit 110. Alternatively, the voltage from PV cell 102, 202 and the control voltage SUPPLY may be active and above the threshold from the self-test, described above.

Thereafter, RST may be pulsed for approximately 1 millisecond to ensure the reset latched value LATCH is still clear from the self-test, and testing signal EVENT may be held active for the duration of the PV channel test. In this example, the PV channel tests may last for 100 milliseconds or more. However, a shorter or longer testing, including longer for independent channels, may also be applicable.

During the testing signal EVENT, both PV+ TEST and PV− TEST may be pulsed high. The reset latched value LATCH may be latched low unless a leakage current or voltage is detected. PV+ TEST and PV− TEST may be pulsed for approximately 45 milliseconds, independently, for each respective test; although shorter or longer durations may also be applicable. Upon successfully bringing PV+ TEST down to inactive after approximately 45 milliseconds, there is a trigger from leakage current. Accordingly, the reset latched value LATCH is latched high indicating a failure of insulation in system 100, 200.

Accordingly, after the testing of each independent PV channel, the safety relay and inverter may be held inactive. Generally, the safety relay and inverter may be operated according to the state of the reset latched value LATCH (e.g., FIG. 1) and/or any of the individually supplied testing signals (e.g., FIG. 2). After completion of the test and operation of the safety relay(s) to remain disconnected, a user or technician may inspect the system 100, 200 in an attempt to correct the failure. In some implementations, a signal, visible indicator, or other feature may be included to indicate/display the failed test. For example, a testing indicator light may be illuminated during the testing shown in FIGS. 12-14, and an indication by the reset latched value LATCH remaining latched may indicate the failure.

As described above, a RISO self-test and independent PV channel testing may operate the associated safety relay(s) of systems 100, 200. Thus, power conversion/generation may remain OFF such that insulation faults do not cause a catastrophic failure, injury, fire, or other damage.

Figure 15:
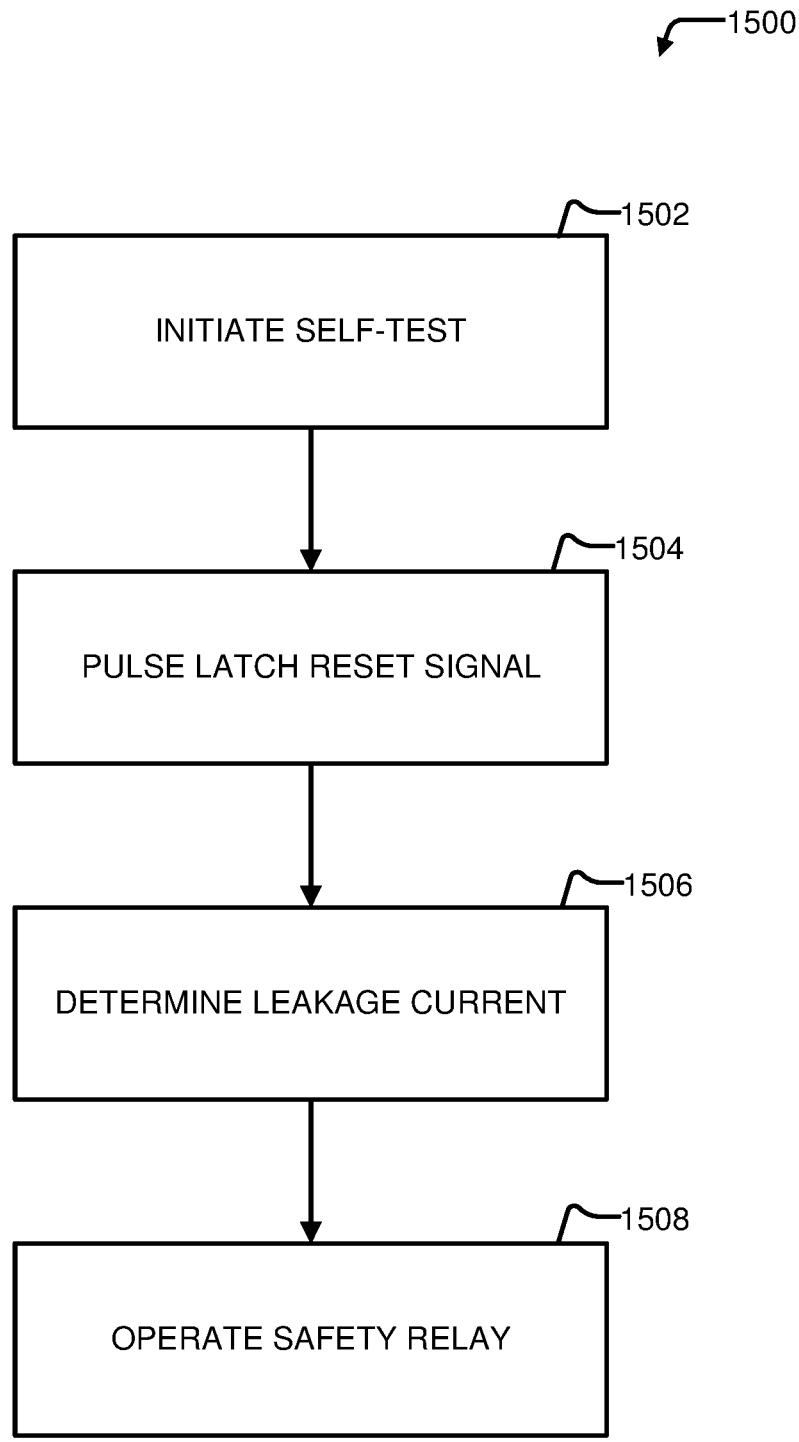
FIG. 15 is a flowchart of a method of resistive isolation detection, in accordance with some implementations; and, FIG. 16 is a block diagram illustrating an example computing device which may be used to implement one or more methods, or portions thereof, described herein, including processing of computer-executable instructions, in accordance with some implementations.

FIG. 15 is a flowchart of a method 1500 of resistive isolation detection, in accordance with some implementations. The method 1500 may be performed by the RISO circuit 110 or may be directed by a computer processor directing the RISO circuit 110.

The method 1500 may include initiating self-test of a resistive isolation detection circuit 110, at block 1502. The self-test is configured to return a reset latched value LATCH representative of a state of the resistive isolation circuit 110. In one implementation, a high latched value LATCH indicates a failure of the self-test. Furthermore, a high latched value LATCH forces associated safety relay(s) 106, 206 to remain OPEN and disconnect a power conversion device from DC rails DC+ and DC−.

The method 1500 also includes pulsing a latch reset signal RST to clear the reset latched value LATCH and a testing signal EVENT to indicate a testing state, at block 1504. In one implementation, the pulsing the latch reset signal RST only occurs if the self-test is successfully completed. Therefore, the method 1500 may conclude at block 1504 if the results of the self-test indicate a self-test failure.

If the self-test is successful, and during the testing signal, the method 1500 includes determining if a leakage current and/or voltage is present in the system 100, 200, at block 1506. For example, in one implementation, the determining of block 1506 includes independently determining that a leakage current is present between a photovoltaic voltage inverter positive channel and earth, and, that a leakage current is present between a photovoltaic voltage inverter negative channel and earth. The same may be reversed such that a negative test occurs before a positive test. Furthermore, the positive channel is referred to as a "high-side" and the negative channel is referred to as a "low-side" in some implementations.

The method 1500 further includes operating a safety relay (e.g., 106, 206) and indication signal responsive to the testing signal and the independent determining, at block 1508. For example, if the testing indicates no leakage current/voltage is present, the safety relay may be closed such that power generation may occur. However, if the testing indicates there is a leakage current/voltage, the safety relay may be held open such that no power generation or connection of DC power rails may occur. In this manner, the system 100, 200 may remain inactive and in a relatively safe configuration if an insulation failure is detected.

As described above, various systems, methods, and apparatuses of leakage current detection have been described. Although particular examples are given related to photovoltaics systems and power generation systems, it should be readily understood that the same is extensible to any form of current detection and safety systems, including detecting any type of leakage, including resistive, capacitive, inductive, or a combination thereof. Accordingly, the systems, methods, and apparatuses described herein are applicable to any suitable electronic device where detecting leakage is desirable.

Hereinafter, a more detailed description of various computing devices that may be used to implement different methods and/or execute computer-executable instructions and/or execute computer-implemented methods is provided with reference to FIG. 16.

Figure 16:
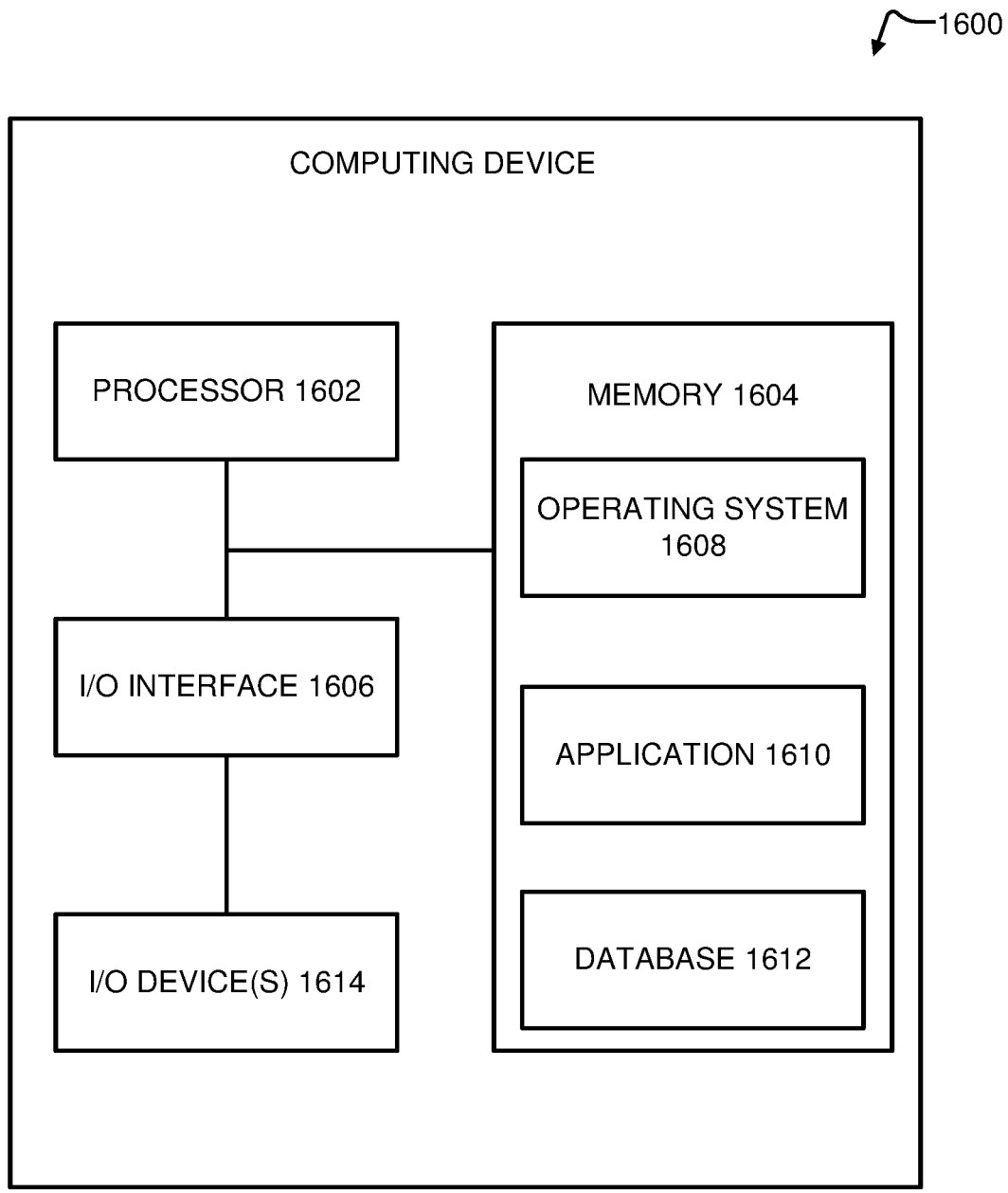

FIG. 16 is a block diagram of an example computing device 1600 which may be used to implement one or more features described herein, in accordance with some implementations. In one example, device 1600 may be used to implement a computer device, and perform appropriate method implementations described herein. Computing device 1600 can be any suitable computer system, server, or other electronic or hardware device. For example, the computing device 1600 can be a mainframe computer, desktop computer, workstation, portable computer, D.S.P, or Microcontroller/microprocessor-based electronic device. In some implementations, device 1600 includes a processor 1602, a memory 1604, input/output (I/O) interface 1606, and audio/video input/output devices 1614 (e.g., display screen, touchscreen, display goggles or glasses, audio speakers, microphone, etc.).

Processor 1602 can be one or more processors and/or processing circuits to execute program code and control basic operations of the device 1600. A "processor" includes any suitable hardware and/or software system, mechanism or component that processes data, signals or other information. A processor may include a system with a general-purpose central processing unit (CPU), multiple processing units, dedicated circuitry for achieving functionality, or other systems. Processing need not be limited to a particular geographic location, or have temporal limitations. Portions of processing may be performed at different times and at different locations, by different (or the same) processing systems. A computer may be any processor in communication with a memory.

Memory 1604 is typically provided in device 1600 for access by the processor 1602, and may be any suitable processor-readable storage medium, e.g., random access memory (RAM), read-only memory (ROM), Electrical Erasable Read-only Memory (EEPROM), Flash memory, etc., suitable for storing instructions for execution by the processor, and located separate from processor 1602 and/or integrated therewith. Memory 1604 can store software operating on the server device 1600 by the processor 1602, including an operating system 1608, various application(s) 1610, and associated data 1612. In some implementations, the processor 1602 is configured to perform various portions (or the entirety) of the methodologies set forth herein.

For example, memory 1604 can include software instructions for performing resistive isolation detection within a system 100 or system 200. Any of software in memory 1604 can alternatively be stored on any other suitable storage location or computer-readable medium. In addition, memory 1604 (and/or other connected storage device(s)) can store instructions and data used in the features described herein. Memory 1604 and any other type of storage (magnetic disk, optical disk, magnetic tape, or other tangible media) can be considered "storage" or "storage devices."

I/O interface 1606 can provide functions to enable interfacing the device 1600 with other systems and devices. For example, network communication devices, storage devices (e.g., memory), and input/output devices can communicate via interface 806. In some implementations, the I/O interface can connect to interface devices including input devices (keyboard, pointing device, touchscreen, microphone, camera, scanner, etc.) and/or output devices (display device, speaker devices, printer, motor, etc.).

For ease of illustration, FIG. 16 shows one block for each of processor 1602, memory 1604, I/O interface 1606, software blocks 1608 and 1610, and database 1612. These blocks may represent one or more processors or processing circuitries, operating systems, memories, I/O interfaces, applications, and/or software modules. In other implementations, device 1600 may not have all of the components shown and/or may have other elements including other types of elements instead of, or in addition to, those shown herein. While the online gaming platform 102 is described as performing operations as described in some implementations herein, any suitable component or combination of components of online gaming platform 102 or similar system, or any suitable processor or processors associated with such a system, may perform the operations described.

The methods, blocks, and/or operations described herein can be performed in a different order than shown or described, and/or performed simultaneously (partially or completely) with other blocks or operations, where appropriate. Some blocks or operations can be performed for one portion of data and later performed again, e.g., for another portion of data. Not all of the described blocks and operations need be performed in various implementations. In some implementations, blocks and operations can be performed multiple times, in a different order, and/or at different times in the methods.

One or more methods described herein (e.g., method 1500) can be implemented by computer program instructions or code, which can be executed on a computer. For example, the code can be implemented by one or more digital processors (e.g., microprocessors or other processing circuitry), and can be stored on a computer program product including a non-transitory computer readable medium (e.g., storage medium), e.g., a magnetic, optical, electromagnetic, or semiconductor storage medium, including semiconductor or solid state memory, magnetic tape, a removable computer diskette, a random access memory (RAM), a read-only memory (ROM), flash memory, a rigid magnetic disk, an optical disk, a solid-state memory drive, etc. The program instructions can also be contained in, and provided as, an electronic signal, for example in the form of software as a service (SaaS) delivered from a server (e.g., a distributed system and/or a cloud computing system). Alternatively, one or more methods can be implemented in hardware (logic gates, etc.), or in a combination of hardware and software. Example hardware can be programmable processors (e.g. Field-Programmable Gate Array (FPGA), Complex Programmable Logic Device), general purpose processors, graphics processors, Application Specific Integrated Circuits (ASICs), and the like. One or more methods can be performed as part of or component of an application running on the system, or as an application or software running in conjunction with other applications and operating system.

One or more methods described herein can be run in a standalone program that can be run on any type of computing device, including factory automation and field automation devices, such as programmable logic controllers in communication with any associated photovoltaics as described herein.

Although the description has been described with respect to particular implementations thereof, these particular implementations are merely illustrative, and not restrictive. Concepts illustrated in the examples may be applied to other examples and implementations.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A resistive isolation detection method, comprising:
    initiating self-test of a resistive isolation detection circuit, the self-test configured to return a reset latched value representative of a state of the resistive isolation circuit;
    pulsing a latch reset signal to clear the reset latched value and a testing signal to indicate a testing state;
    during the testing signal, independently determining,
        that a leakage current is present between a photovoltaic power conversion device positive channel and earth, and,
        that a leakage current is present between a photovoltaic power conversion device negative channel and earth; and,
    operating a safety relay and indication signal responsive to the testing signal and the independent determining.

2. The method of claim 1, wherein the reset latched value is a hardware latch signal operative to maintain the safety relay in an open state responsive to a failed self-test.

3. The method of claim 1, wherein the reset latched value is a hardware latch signal operative to maintain the safety relay in an open state responsive to a leakage current being present at either of the photovoltaic power conversion device positive channel and earth, and, the photovoltaic power conversion device negative channel and earth.

4. The method of claim 1, wherein the testing signal is maintained for a duration of the independently determining.

5. The method of claim 1, wherein operating the safety relay comprises:
    maintaining an open state of the safety relay responsive to a leakage current being present between a photovoltaic power conversion device positive channel and earth.

6. The method of claim 1, wherein operating the safety relay comprises:
    maintaining an open state of the safety relay responsive to a leakage current being present between a photovoltaic power conversion device negative channel and earth.

7. The method of claim 1, wherein operating the safety relay comprises:
    initiating a closed state of the safety relay responsive to no leakage current being present between a photovoltaic power conversion device positive channel and earth.

8. The method of claim 1, wherein operating the safety relay comprises:
    initiating a closed state of the safety relay responsive to no leakage current being present between a photovoltaic power conversion device negative channel and earth.

9. The method of claim 1, wherein the latch reset signal is enabled responsive to a successful self-test.

10. A resistive isolation detection circuit, comprising an event manager system configured to perform testing operations comprising:
    initiating self-test of a resistive isolation detection circuit, the self-test configured to return a reset latched value representative of a state of the resistive isolation circuit;
    pulsing a latch reset signal to clear the reset latched value and a testing signal to indicate a testing state;
    during the testing signal, independently determining, that a leakage current is present between a photovoltaic power conversion device positive channel and earth, and, that a leakage current is present between a photovoltaic power conversion device negative channel and earth; and, operating a safety relay and indication signal responsive to the testing signal and the independent determining.

11. A system comprising:

a photovoltaic cell;

a power conversion device in operative communication with the photovoltaic cell; and a resistive isolation detection circuit in operative communication with the power conversion device, wherein the resistive isolation detection circuit is configured to perform testing operations comprising:

initiating self-test configured to return a reset latched value representative of a state of the resistive isolation circuit;

pulsing a latch reset signal to clear the reset latched value and a testing signal to indicate a testing state;

during the testing signal, independently determining, that a leakage current is present between the photovoltaic power conversion device positive channel and earth, and, that a leakage current is present between the photovoltaic power conversion device negative channel and earth; and, operating a safety relay and indication signal responsive to the testing signal and the independent determining.

12. The system of claim 11, further comprising a photovoltaic inverter in operative communication with the power conversion device.

13. The system of claim 12, wherein the photovoltaic power inverter is configured to invert DC power received from the power conversion device into AC power for a power grid.

14. The system of claim 11, further comprising a plurality of photovoltaic cells in operative communication with the power conversion device.

15. The system of claim 11, wherein the resistive isolation circuit comprises an event manager system configured to perform the testing operations.

16. The system of claim 11, wherein the reset latched value is a hardware latch signal operative to maintain the safety relay in an open state responsive to a failed self-test.

17. The system of claim 11, wherein the reset latched value is a hardware latch signal operative to maintain the safety relay in an open state responsive to a leakage current being present at either of the photovoltaic power conversion device positive channel and earth, and, the photovoltaic power conversion device negative channel and earth.

18. The system of claim 11, wherein the testing signal is maintained for a duration of the independently determining.

19. The system of claim 11, wherein operating the safety relay comprises:

maintaining an open state of the safety relay responsive to a leakage current being present between a photovoltaic power conversion device positive channel and earth; and, maintaining an open state of the safety relay responsive to a leakage current being present between a photovoltaic power conversion device negative channel and earth.

20. The system of claim 11, wherein operating the safety relay comprises:

initiating a closed state of the safety relay responsive to no leakage current being present between a photovoltaic power conversion device positive channel and earth; and, maintaining a closed state of the safety relay responsive to no leakage current being present between a photovoltaic power conversion device negative channel and earth.

* * * * *